(12) United States Patent
Soeno

(10) Patent No.: US 8,330,185 B2
(45) Date of Patent: Dec. 11, 2012

(54) SEMICONDUCTOR DEVICE HAVING SEMICONDUCTOR SUBSTRATE INCLUDING DIODE REGION AND IGBT REGION

(75) Inventor: Akitaka Soeno, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/242,072

(22) Filed: Sep. 23, 2011

(65) Prior Publication Data

US 2012/0007141 A1    Jan. 12, 2012

Related U.S. Application Data

(63) Continuation of application No. PCT/JP2009/066000, filed on Sep. 14, 2009.

(51) Int. Cl.
*H01L 29/74* (2006.01)
*H01L 31/111* (2006.01)

(52) U.S. Cl. ........ 257/140; 257/146; 257/133; 257/139; 438/135

(58) Field of Classification Search .................. 257/140, 257/133, 139, 146, E27.016; 438/135
See application file for complete search history.

(56) References Cited

U.S. PATENT DOCUMENTS

| | | | | |
|---|---|---|---|---|
| 5,162,876 A | * | 11/1992 | Kitagawa et al. | ............ 257/138 |
| 5,352,915 A | * | 10/1994 | Hutchings et al. | ............ 257/361 |
| 6,180,966 B1 | | 1/2001 | Kohno et al. | |
| 2005/0258493 A1 | | 11/2005 | Aono et al. | |

FOREIGN PATENT DOCUMENTS

| | | |
|---|---|---|
| JP | 10-041510 A | 2/1998 |
| JP | 10-326897 A | 12/1998 |
| JP | 11-017179 A | 1/1999 |

(Continued)

OTHER PUBLICATIONS

International Search Report of PCT/JP2009/066000 mailed Dec. 15, 2009.
Translation of Written Opinion of the International Searching Authority of PCT/JP2009/066000 mailed Dec. 4, 2009.
Translation of International Preliminary Report on Patentability of PCT/JP2009/066000 mailed May 11, 2010.

*Primary Examiner* — Theresa T Doan
(74) *Attorney, Agent, or Firm* — Kenyon & Kenyon LLP

(57) ABSTRACT

A semiconductor device, including a semiconductor substrate in which a diode region and an IGBT region are formed, is provided. A lifetime control region is formed within a diode drift region. The diode drift region and the IGBT drift region are a continuous region across a boundary region between the diode region and the IGBT region. A first separation region and a second separation region are formed within the boundary region. The first separation region is formed of a p-type semiconductor, formed in a range extending from an upper surface of the semiconductor substrate to a position deeper than both of a lower end of an anode region and a lower end of a body region, and bordering with the anode region. The second separation region is formed of a p-type semiconductor, formed in a range extending from the upper surface of the semiconductor substrate to a position deeper than both of the lower end of the anode region and the lower end of the body region, and bordering with the body region. The second separation region is separated from the first separation region.

2 Claims, 2 Drawing Sheets

FOREIGN PATENT DOCUMENTS

| | | |
|---|---|---|
| JP | 2002-314082 A | 10/2002 |
| JP | 2005-317751 A | 11/2005 |
| JP | 2008-192737 A | 8/2008 |
| JP | 2008-211148 A | 9/2008 |
| JP | 2008-235405 A | 10/2008 |
| JP | 2009-170670 A | 7/2009 |
| WO | 2010/143288 A1 | 12/2010 |
| WO | 2011/027473 A1 | 3/2011 |

* cited by examiner

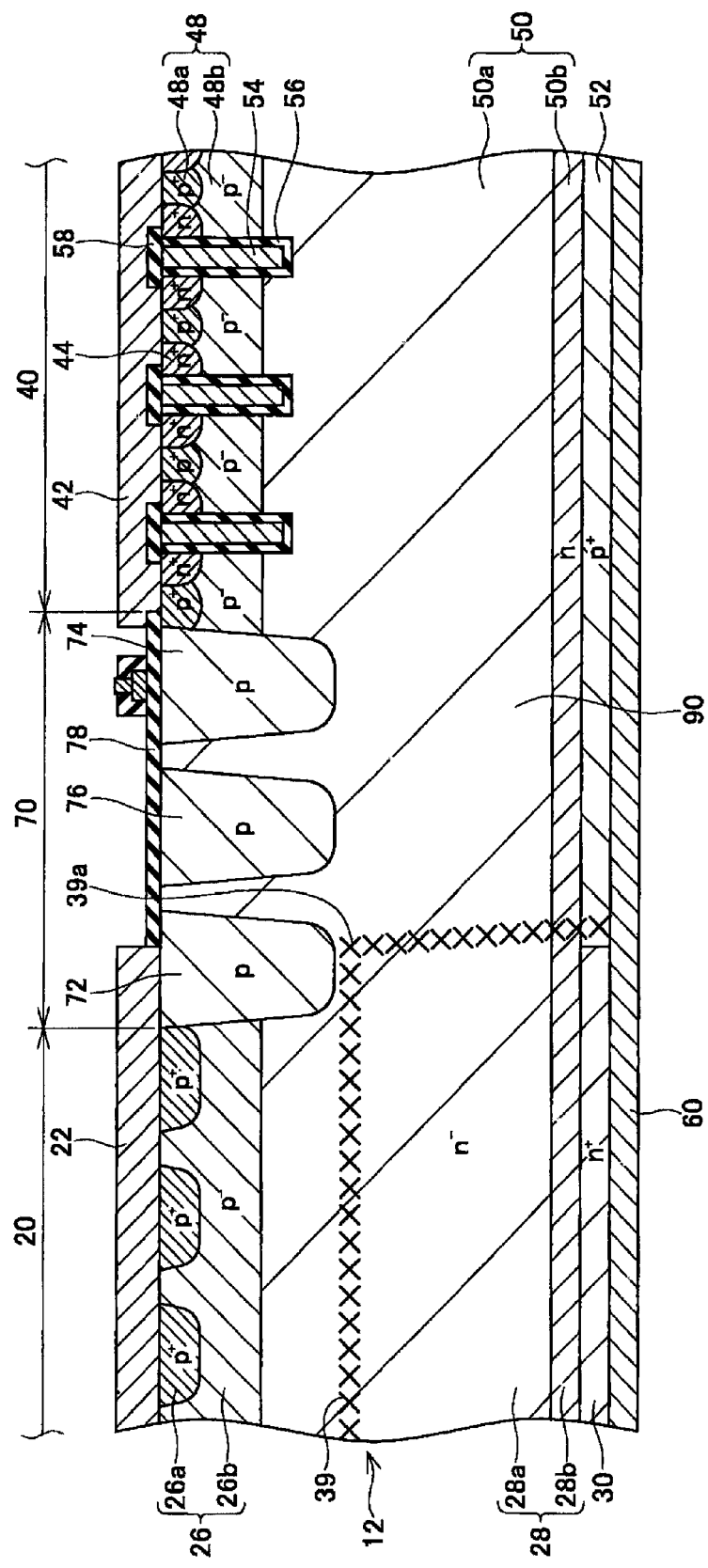

SEMICONDUCTOR DEVICE HAVING SEMICONDUCTOR SUBSTRATE INCLUDING DIODE REGION AND IGBT REGION

CROSS-REFERENCE TO RELATED APPLICATION

This application is a continuation of PCT application serial no. PCT/JP2009/066000 filed on Sep. 14, 2009, which PCT application designates the United States of America. PCT application serial no. PCT/JP2009/066000 is hereby incorporated by reference in the entirety.

FIELD

The present teachings relate to a semiconductor device having a semiconductor substrate in which a diode region and an IGBT region are formed.

DESCRIPTION OF RELATED ART

Japanese Patent Application Laid-Open No. 2008-235405 discloses a semiconductor device having a semiconductor substrate in which a diode region and an IGBT region are formed. In this semiconductor device, a p-type region is formed within a boundary region between the diode region and the IGBT region. The p-type region is formed in a range extending from an upper surface of the semiconductor substrate to a position deeper than both of a lower end of an anode region and a lower end of a body region. Further, the p-type region borders with the anode region and the body region. By forming the deep p-type region as aforementioned, an electric field to be concentrated on a gate electrode and the body region near the boundary of the IGBT region and the diode region is suppressed.

BRIEF SUMMARY

According to the semiconductor device of Japanese Patent Application Laid-Open No. 2008-235405, the deep p-type region is connected to an anode electrode via the anode region, and is also connected to an emitter electrode via the body region. The semiconductor device having a diode and an IGBT, as in the case of Japanese Patent Application Laid-Open No. 2008-235405, is used in a state where the anode electrode of the diode and the emitter electrode of the IGBT are conducted. In other words, when forward voltage is applied between the anode electrode and a cathode electrode, the emitter electrode also becomes high potential, similar to the anode electrode. When the forward voltage is applied to the diode of the semiconductor device of Japanese Patent Application Laid-Open No. 2008-235405, the anode electrode and the emitter electrode become high potential, and due to this, the deep p-type region also becomes high potential. As a result, electric current flows from the deep p-type region to the cathode electrode via a drift region and the cathode region which are under the deep p-type region. Thus in the semiconductor device of Japanese Patent Application Laid-Open No. 2008-235405, a parasitic diode is formed by the deep p-type region, the drift region and the cathode region.

In some cases, a lifetime control region may be formed in the drift region of the diode (hereafter called diode drift region) in order to suppress the reverse current which flows when the diode performs the reverse recovery operation. The lifetime control region is a region where the lifetime of carriers is shortened by forming crystal defects or the like. If the lifetime control region is formed in the diode drift region of the semiconductor device of Japanese Patent Application Laid-Open No. 2008-235405, a following problem occurs. As mentioned above, the parasitic diode is formed in the semiconductor device of Japanese Patent Application Laid-Open No. 2008-235405. When the diode performs the reverse recovery operation, most of the carriers in the diode drift region are dissipated in the lifetime control region by recombination. Therefore high reverse current does not flow in the diode region. On the other hand, the reverse current also flows in the parasitic diode when the reverse recovery operation is performed. The reverse current that flows in the parasitic diode does not pass the lifetime control region, hence the reverse current that flows in the parasitic diode is large. By the reverse current generated due to the parasitic diode, the loss generated during the reverse recovery operation increases.

The present specification provides a semiconductor device having a diode and an IGBT, which hardly generates the reverse current when the diode performs the reverse recovery operation.

A semiconductor device disclosed by the present specification includes a semiconductor substrate in which a diode region and an IGBT region are formed. An anode region, a diode drift region, and a cathode region are formed within the diode region. The anode region is formed of a p-type semiconductor and formed in a range including an upper surface of the semiconductor substrate. The diode drift region is formed of an n-type semiconductor and formed under the anode region. The cathode region is formed of an n-type semiconductor, which has a higher concentration of n-type impurities than that in the diode drift region, and formed in a range which is under the diode drift region and includes a lower surface of the semiconductor substrate. An emitter region, a body region, an IGBT drift region, a collector region, and a gate electrode are formed within the IGBT region. The emitter region is formed of an n-type semiconductor and formed in a range including the upper surface of the semiconductor substrate. The body region is formed of a p-type semiconductor and formed in a range under the emitter region and a range including an upper surface of the semiconductor substrate. The IGBT drift region is formed of an n-type semiconductor, formed under the body region, and separated from the emitter region by the body region. The collector region is formed of a p-type semiconductor and formed in a range which is under the IGBT drift region and includes a lower surface of the semiconductor substrate. The gate electrode is facing a range of the body region via an insulating film, wherein the range of the body region is a range separating the emitter region from the IGBT drift region. A lifetime control region is formed within the diode drift region. A carrier lifetime in the lifetime control region is shorter than that in the diode drift region outside the lifetime control region. The diode drift region and the IGBT drift region are a continuous region across a boundary region between the diode drift region and the IGBT drift region. A first separation region, a second separation region and an n-type region are formed within the boundary region. The first separation region is formed of a p-type semiconductor, formed in a range extending from the upper surface of the semiconductor substrate to a position deeper than both a lower end of the anode region and a lower end of the body region, and bordering with the anode region. The second separation region is formed of a p-type semiconductor, formed in a range extending from the upper surface of the semiconductor substrate to a position deeper than both of the lower end of the anode region and the lower end of the body region, and bordering with the body region. The n-type region is formed between the first separation region and the second separation region, and separating the first separation region from the second separation region.

In this semiconductor device, the first separation region and the second separation region are formed within the boundary region. In other words, two deep p-layers, which are separated from each other, are formed within the boundary region. The electric field being localized to the gate electrode and the body region of the IGBT near the boundary region can be suppressed by the first separation region and the second separation region. Furthermore, reverse current of the diode within the diode region is suppressed by the lifetime control region. Also, the reverse current hardly flows in the second separation region when the diode performs the reverse recovery operation in the diode region, since the second separation region bordering with the body region is not bordering with the cathode region of the diode region. Therefore the reverse current which flows via the boundary region is less than reverse current which flows in a semiconductor device where one deep p-type region (p-type region bordering with both of the anode region and the body region) is formed within the boundary region. Hence, in this semiconductor device, the reverse current hardly flows when the diode performs the reverse recovery operation.

It is preferable that the above mentioned semiconductor device further includes a third separation region which is formed between the first separation region and the second separation region. The third separation region is formed of a p-type semiconductor, formed in a range extending from the upper surface of the semiconductor substrate to a position deeper than both of the lower end of the anode region and the lower end of the body region, and separated from both of the first separation region and the second separation region by the n-type region.

In this semiconductor device, an electric field to be concentrated on the gate electrode and the body region of the IGBT near the boundary region can be suppressed by the first separation region, the second separation region and the third separation region. The third separation region is separated from the first separation region and the second separation region, hence reverse current does not flow in the third separation region. Since the boundary region is formed by a structure including the third separation region where the reverse current does not flow, the reverse current in the boundary region can be further suppressed.

In the above mentioned semiconductor device, it is preferable that an end of the lifetime control region on a side of the IGBT region is located under the first separation region.

By extending the lifetime control region to a position under the first separation region as aforementioned, the reverse current that flows in the first separation region can be decreased.

BRIEF DESCRIPTION OF DRAWINGS

FIG. 2 is a vertical cross-sectional view depicting a semiconductor device of a second embodiment.

DETAILED DESCRIPTION OF THE PREFERRED EMBODIMENT

First Embodiment

Figure 1:
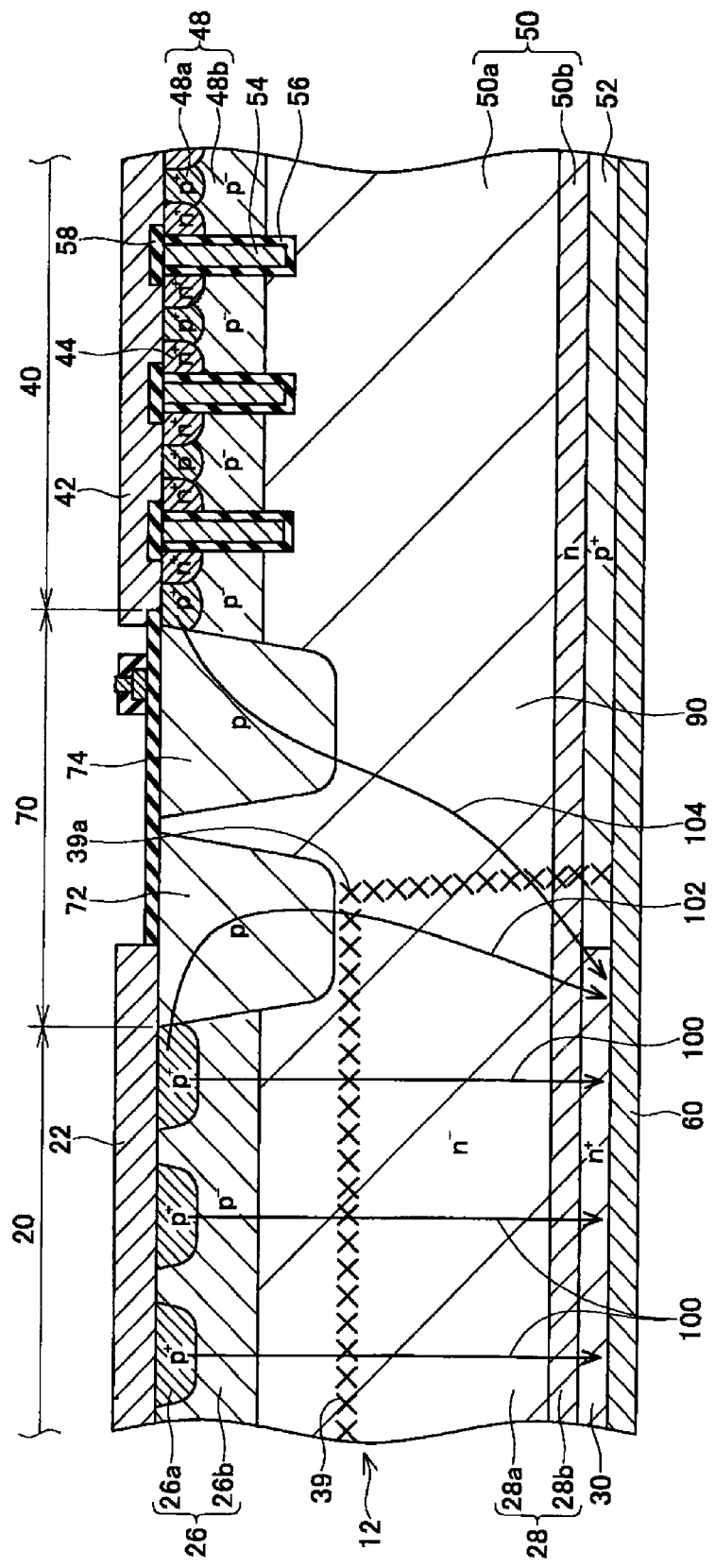
FIG. 1 is a vertical cross-sectional view depicting a semiconductor device of a first embodiment.

A semiconductor device according to a first embodiment will now be described.
(Structure of Semiconductor Device)

As FIG. 1 shows, a semiconductor device 10 comprises a semiconductor substrate 12 and metal layers and insulation layers which are formed on an upper surface and a lower surface of the semiconductor substrate 12. A diode region 20 and an IGBT region 40 are formed in the semiconductor substrate 12.

An anode electrode 22 is formed on an upper surface of the semiconductor substrate 12 within the diode region 20. An emitter electrode 42 is formed on an upper surface of the semiconductor substrate 12 within the IGBT region 40. A common electrode 60 is formed on an entire area of a lower surface of the semiconductor substrate 12.

An anode layer 26, a diode drift layer 28 and a cathode layer 30 are formed within the diode region 20.

The anode layer 26 is formed of a p-type semiconductor. The anode layer 26 has an anode contact region 26a and a low concentration anode layer 26b. The anode contact region 26a is formed in an island shape in a range including the upper surface of the semiconductor substrate 12. A concentration of impurities in the anode contact region 26a is high. The anode contact region 26a is connected to the anode electrode 22 by ohmic connection. The low concentration anode layer 26b is formed under and on the sides of the anode contact region 26a, so as to cover the anode contact region 26a. A concentration of impurities in the low concentration anode layer 26b is lower than that in the anode contact region 26a. A position of a lower end of the anode layer 26 is shallower than a position of a lower end of a later mentioned gate electrode 54.

The diode drift layer 28 is formed under the anode layer 26. The diode drift layer 28 is formed of an n-type semiconductor. The diode drift layer 28 has a drift layer 28a and a buffer layer 28b. The drift layer 28a is formed under the anode layer 26. A concentration of impurities in the drift layer 28a is low. The buffer layer 28b is formed under the drift layer 28a. Concentration of impurities in the buffer layer 28b is higher than that in the drift layer 28a.

The cathode layer 30 is formed under the diode drift layer 28. The cathode layer 30 is formed in a range including the lower surface of the semiconductor substrate 12. The cathode layer 30 is formed of an n-type semiconductor, and a concentration of impurities in the cathode layer 30 is high. The cathode layer 30 is connected to the common electrode 60 by ohmic connection.

Within the diode region 20, a diode is formed by the anode layer 26, the diode drift layer 28 and the cathode layer 30. Hereafter the diode formed within the diode region 20 is called a diode 20.

Within the IGBT region 40, an emitter region 44, a body layer 48, an IGBT drift layer 50, a collector layer 52 and the gate electrode 54 are formed.

A plurality of trenches is formed on an upper surface of the semiconductor substrate 12 within the IGBT region 40. A gate insulation film 56 is formed on an inner face of each trench. The gate electrode 54 is formed inside each trench. An upper surface of the gate electrode 54 is covered with an insulation film 58. The gate electrode 54 is insulated from the emitter electrode 42.

The emitter region 44 is formed in an island shape in a range including the upper surface of the semiconductor substrate 12. The emitter region 44 is formed in a range bordering with the gate insulation film 56. The emitter region 44 is formed of an n-type semiconductor, and a concentration of impurities in the emitter region 44 is high. The emitter region 44 is connected to the emitter electrode 42 by ohmic connection.

The body layer 48 is formed of a p-type semiconductor. The body layer 48 has a body contact region 48a and a low concentration body layer 48b. The body contact region 48a is formed in an island shape in a range including the upper surface of the semiconductor substrate 12. The body contact region 48a is formed between two emitter regions 44. A concentration of impurities in the body contact region 48a is high. The body contact region 48a is connected to the emitter electrode 42 by ohmic connection. The low concentration body layer 48b is formed under the emitter region 44 and the body contact region 48a. The low concentration body layer 48*b* is formed in a range shallower than the position of the lower end of the gate electrode 54. A concentration of impurities in the low concentration body layer 48*b* is lower than that in the body contact region 48*a*. The emitter region 44 is separated from the IGBT drift layer 50 by the low concentration body layer 48*b*. The gate electrode 54 is facing the low concentration body layer 48*b*, via the gate insulation film 56, in a range where the low concentration body layer 48*b* separates the emitter region 44 from the IGBT drift layer 50.

The IGBT drift layer 50 is formed under the body layer 48. The IGBT drift layer 50 is formed of an n-type semiconductor. The IGBT drift layer 50 has a drift layer 50*a* and a buffer layer 50*b*. The drift layer 50*a* is formed under the body layer 48. A concentration of impurities in the drift layer 50*a* is low. The concentration of impurities in the drift layer 50*a* is approximately the same as that in the diode drift layer 28. The drift layer 50*a* and the drift layer 28*a* are continuous across a later mentioned boundary region 70. Hereafter the drift layer 28*a* and the drift layer 50*a* may collectively be called a drift layer 90. The buffer layer 50*b* is formed under the drift layer 50*a*. A concentration of impurities in the buffer layer 50*b* is higher than that in the drift layer 50*a*. The buffer layer 50*b* and the drift layer 28*b* are continuous across the later mentioned boundary region 70.

The collector layer 52 is formed under the IGBT drift layer 50. The collector layer 52 is formed in a range including a lower surface of the semiconductor substrate 12. The collector layer 52 is formed of a p-type semiconductor, and a concentration of impurities in the collector layer 52 is high. The collector layer 52 is connected to the common electrode 60 by ohmic connection. The collector layer 52 borders with the cathode layer 30. The boundary between the collector layer 52 and the cathode layer 30 is located right under a later mentioned separation region 72.

Within the IGBT region 40, an IGBT is formed by the emitter region 44, the body layer 48, the IGBT drift layer 50, the collector layer 52 and the gate electrode 54.

The boundary region 70 exists between the diode region 20 and the IGBT region 40. Two separation regions 72 and 74 are formed within the boundary region 70. The separation regions 72 and 74 are formed in a range extending from the upper surface of the semiconductor substrate 12 to a position deeper than both of the lower end of the anode layer 26 and a lower end of the body layer 48. More specifically, the separation regions 72 and 74 are formed in a range extending from the upper surface of the semiconductor substrate 12 to a position deeper than the lower end of the gate electrode 54. The separation region 72 borders with the anode layer 26. The separation region 72 is formed of a p-type semiconductor. A concentration of impurities in the separation region 72 is higher than those in the low concentration anode layer 26*b* and the low concentration body layer 48*b*. The separation region 74 borders with the body layer 26. The separation region 74 is formed of a p-type semiconductor. A concentration of impurities in the separation range 74 is higher than those in the low concentration anode layer 26*b* and the low concentration body layer 48*b*. A drift layer 90 exists between the separation region 72 and the separation region 74. The separation region 72 and the separation region 74 are separated from each other by the drift layer 90. If the IGBT is OFF, a depletion layer extends from the separation regions 72 and 74 into the drift layer 90 thereunder. Due to this, an electric field to be concentrated on an area near the boundary region 70 is suppressed. In particular, the electric field to be concentrated on the gate electrode 54 near the separation region 70 is suppressed, since the separation regions 72 and 74 are formed to the position deeper than the lower end of the gate electrode 54.

The diode drift layer 28 and the IGBT drift layer 50 are continuous under the separation regions 72 and 74. The cathode layer 30 in the diode region 20 extends to a position in the boundary region 70, and the collector layer 52 in the IGBT region 40 extends to the position in the boundary region 70. The cathode layer 30 borders with the collector layer 52 right under the separation region 72. The cross-sectional structure of the boundary region 70 shown in FIG. 1 is formed along the boundary of the diode region 20 and the IGBT region 40.

A carrier lifetime control region 39 is formed within the diode drift layer 28. In the carrier lifetime control region 39, crystal defects, which are formed by implanting charged particles into the semiconductor substrate 12, exist. The concentration of the crystal defects in the carrier lifetime control region 39 is much higher than that in the diode drift layer 28 around the carrier lifetime control region 39. The carrier lifetime control region 39 is formed at a depth which is close to the anode layer 26 and deeper than the lower end of the separation region 72. A reference number 39*a* indicates an end of the carrier lifetime control region 39 on the IGBT region 40 side. The crystal defects are distributed along the depth direction (vertical direction in FIG. 1) in an area outside the end 39*a* (on the IGBT region 40 side). This is because when charged particles are implanted, the implanting depth of the charged particles changes in a peripheral area of an aperture portion of a mask. The concentration of crystal defects distributed along the depth direction is low, and therefore the crystal defects hardly influence the characteristics of the semiconductor device 10. The end 39*a* of the carrier lifetime control region 39 is located right under the separation region 72. In other words, the end 39*a* of the carrier lifetime control region 39 extends along the separation region 72.

(Operation of Diode of Semiconductor Device)

Operation of the diode 20 of the semiconductor device 10 will be described. When generating electric current in the diode 20, forward voltage is applied to the diode 20. In other words, voltage to make the anode electrode 22 positive is applied between the anode electrode 22 and the common electrode 60. The semiconductor device 10 is used in a state of the anode electrode 22 and the emitter electrode 42 being conducted. Therefore if forward voltage is applied to the diode 20, the potential of the emitter electrode 42 increases to a level of a potential approximately the same as that of the anode electrode 22. If the forward voltage is applied, the diode 20 turns ON. In other words, as the arrow marks 100 in FIG. 1 indicate, electric current flows from the anode electrode 22 to the common electrode 60 via the anode layer 26, the diode drift layer 28 and the cathode layer 30.

In the semiconductor device 10, a parasitic diode is formed by the anode layer 26, the separation region 72, the drift layer 90 and the cathode layer 30 (hereafter called a first parasitic diode). If forward voltage is applied, the first parasitic diode turns ON, and the electric current also flows from the anode electrode 22 to the common electrode 60 via a path indicated by an arrow mark 102 in FIG. 1.

In the semiconductor device 10, another parasitic diode is formed by the body contact region 48*a*, the separation region 74, the drift layer 90 and the cathode layer 30 (hereafter called a second parasitic diode). If forward voltage is applied and the potential of the emitter electrode 42 becomes high, the electric current flows from the emitter electrode 42 to the common electrode 60 via a path indicated by an arrow mark 104 in FIG. 1. However, in the semiconductor device 10, since the separation region 74 is separated from the separation region 72, the distance from the separation region 74 to the cathode region 30 is long. As a consequence, an amount of the electric current that flows via the path indicated by the arrow mark 104 is extremely small.

If the voltage applied to the diode 20 is switched from the forward voltage to the reverse voltage, the diode 20 performs the reverse recovery operation. In other words, holes, which existed in the diode drift layer 28 when the forward voltage was applied, are exhausted to the anode electrode 22, and the electrons, which existed in the diode drift layer 28 when the forward voltage was applied, are exhausted to the common electrode 60. Due to this, reverse current flows in the diode 20 in the opposite direction of the arrow mark 100 in FIG. 1. The reverse current attenuates in a short time, and the amount of the electric current that flows in the diode 20 becomes virtually zero thereafter. The crystal defects in the carrier lifetime control region 39 function as recombining centers of carriers. Hence upon performing the reverse recovery operation, many carriers in the diode drift layer 28 are recombined and dissipate in the carrier lifetime control region 39. Therefore the amount of the reverse current that flows in the diode 20 is small.

When the diode 20 performs the reverse recovery operation, the reverse current also flows in the first parasitic diode. In other words, the reverse current flows in an opposite direction of the arrow mark 102 in FIG. 1. As mentioned above, the carrier lifetime control region 39 is formed under the separation region 72. Therefore the reverse current that flows in the first parasitic diode passes through the carrier lifetime control region 39. Because of this, most of the carriers dissipate in the lifetime control region 39. As a consequence, the amount of the reverse current that flows in the first parasitic diode is also small.

When the diode 20 performs the reverse recovery operation, reverse current also flows in the second parasitic diode. In other words, the reverse current flows in an opposite direction of the arrow mark 104 in FIG. 1. However, as mentioned above, the amount of the electric current that flows in the second parasitic diode when the forward voltage is applied is extremely small. Therefore, when the diode 20 performs the reverse recovery operation, the amount of carriers existing on the electric current path (arrow mark 104) of the second parasitic diode is very small. As a consequence, the amount of the reverse current that flows in the second parasitic diode is very small.

As described above, according to the semiconductor device 10 of the first embodiment, the separation region 74 is separated from the separation region 72, therefore the amount of the reverse current that flows in the separation region 74 is extremely small. As a consequence, generation of loss due to the reverse current is suppressed.

Furthermore, according to the semiconductor device 10 of the first embodiment, the lifetime control region 39 is formed in the drift layer 90 under the separation region 72. Due to this, the reverse current that flows in the separation region 72 is suppressed. As a consequence, generation of loss due to the reverse current is further suppressed.

Second Embodiment

A semiconductor device 110 according to a second embodiment will be described next. A width of a boundary region 70 of the semiconductor device 110 of the second embodiment is approximately the same as the width of the boundary region 70 of the semiconductor device 10 of the first embodiment. According to the semiconductor device 110 of the second embodiment, a width of a separation region 72 and a width of a separation region 74 are smaller than those of the semiconductor device 10 of the first embodiment, and a separation region 76 is formed between the separation region 72 and the separation region 74. The rest of the configuration of the semiconductor device 110 of the second embodiment is the same as that of the semiconductor device 10 of the first embodiment.

The separation region 76 is formed in a range extending from the upper surface of the semiconductor substrate 12 to a position deeper than the lower end of the gate electrode 54. The separation region 76 is formed of a p-type semiconductor. A concentration of impurities in the separation region 76 is higher than those in the low concentration anode layer 26b and the low concentration body layer 48b. An upper surface of the separation region 76 is covered with the insulation layer 78. The drift layer 90 exists between the separation region 76 and the separation region 72. The separation region 76 and the separation region 72 are separated from each other by the drift layer 90. The drift layer 90 exists between the separation region 76 and the separation region 74. The separation region 76 and the separation region 74 are separated from each other by the drift layer 90. By the separation regions 72, 74 and 76, an electric field to be concentrated on the gate electrode 54 and the body layer 48 near the boundary region 70 is suppressed.

The separation region 76 is surrounded by the drift region 90. Therefore when the forward voltage is applied to the diode 20, the separation region 76 does not become a path of electric current. Hence the reverse current does not flow in the separation region 76 even when the diode 20 performs the reverse recovery operation. The widths of the separation regions 72 and 74 are small because of the separation region 76 being formed therebetween. The smaller width of the separation region 72 makes it more difficult for the reverse current to flow. Not only the smaller width of the separation region 74, but also the longer distance from the separation region 74 to the cathode region 30 makes it even more difficult for the reverse current to flow. As a consequence, according to the semiconductor device 110 of the second embodiment, it is more difficult for the reverse current to flow than the case of the semiconductor device 10 of the first embodiment.

As described above, in the semiconductor device of the first embodiment and the semiconductor device of the second embodiment, a plurality of separation regions is placed within the boundary region. As a consequence, the concentration of the electric field on an area near the boundary region is suppressed, and reverse current flowing in the boundary region is suppressed.

In the above mentioned second embodiment, three separation regions are formed in the boundary region, but four or more separation regions may be formed within the boundary region.

The invention claimed is:
1. A semiconductor device comprising a semiconductor substrate in which a diode region and an IGBT region are formed, wherein
an anode region, a diode drift region, and a cathode region are formed within the diode region,
the anode region is formed of a p-type semiconductor and formed in a range including an upper surface of the semiconductor substrate,
the diode drift region is formed of an n-type semiconductor and formed under the anode region,
the cathode region is formed of an n-type semiconductor, which has a higher concentration of n-type impurities than that in the diode drift region, and formed in a range which is under the diode drift region and includes a lower surface of the semiconductor substrate, an emitter region, a body region, an IGBT drift region, a collector region, and a gate electrode are formed within the IGBT region, the emitter region is formed of an n-type semiconductor and formed in a range including the upper surface of the semiconductor substrate, the body region is formed of a p-type semiconductor and formed in a range under the emitter region and a range including an upper surface of the semiconductor substrate, the IGBT drift region is formed of an n-type semiconductor, formed under the body region, and separated from the emitter region by the body region, the collector region is formed of a p-type semiconductor and formed in a range which is under the IGBT drift region and includes a lower surface of the semiconductor substrate, the gate electrode is facing a range of the body region via an insulating film, wherein the range of the body region is a range separating the emitter region from the IGBT drift region, a lifetime control region is formed within the diode drift region, wherein a carrier lifetime in the lifetime control region is shorter than that in the diode drift region outside the lifetime control region, the diode drift region and the IGBT drift region are a continuous region across a boundary region between the diode region and the IGBT region, a first separation region, a second separation region, and an n-type region are formed within the boundary region, the first separation region is formed of a p-type semiconductor, formed in a range extending from the upper surface of the semiconductor substrate to a position deeper than both of a lower end of the anode region and a lower end of the body region, and bordering with the anode region, the second separation region is formed of a p-type semiconductor, formed in a range extending from the upper surface of the semiconductor substrate to a position deeper than both of the lower end of the anode region and the lower end of the body region, and bordering with the body region, the n-type region is formed of an n-type semiconductor, formed between the first separation region and the second separation region, and separating the first separation region from the second separation region, and an end of the lifetime control region on a side of the IGBT region is located under the first separation region.

2. A semiconductor device of claim 1, further comprising a third separation region which is formed of a p-type semiconductor, formed in a range extending from the upper surface of the semiconductor substrate to a position deeper than both of the lower end of the anode region and the lower end of the body region, formed between the first separation region and the second separation region, and separated from both of the first separation region and the second separation region by the n-type region.

* * * * *